United States Patent
Chiu et al.

(10) Patent No.: US 12,326,463 B2
(45) Date of Patent: Jun. 10, 2025

(54) PROBE CARD NEEDLE SHAPE AND METHOD OF MANUFACTURING

(71) Applicant: Taiwan Semiconductor Manufacturing Co., Ltd., Hsinchu (TW)

(72) Inventors: Ting-Yu Chiu, Hsinchu (TW); Yi-Neng Chang, Hsinchu (TW); Wen-Chun Tu, Hsinchu (TW); Te-Kun Lin, Hsinchu (TW); Chien Fang Huang, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 228 days.

(21) Appl. No.: 18/165,863

(22) Filed: Feb. 7, 2023

(65) Prior Publication Data

US 2024/0151743 A1 May 9, 2024

Related U.S. Application Data

(60) Provisional application No. 63/382,473, filed on Nov. 4, 2022.

(51) Int. Cl.
*G01R 1/067* (2006.01)
*C25D 5/08* (2006.01)
*C25D 7/00* (2006.01)

(52) U.S. Cl.
CPC ............ *G01R 1/0675* (2013.01); *C25D 5/08* (2013.01); *C25D 7/00* (2013.01); *G01R 1/06738* (2013.01)

(58) Field of Classification Search
CPC .................................................. G01R 1/0675
See application file for complete search history.

(56) References Cited

U.S. PATENT DOCUMENTS

| 6,170,116 B1 | 1/2001 | Mizuta | |
| 2015/0159293 A1* | 6/2015 | Oberlitner | C25D 21/14 |
| | | | 204/275.1 |
| 2019/0064216 A1* | 2/2019 | Genkin | G01R 31/2831 |

FOREIGN PATENT DOCUMENTS

| CN | 101002103 A | 7/2007 |
| TW | 200305022 A | 10/2003 |
| TW | 200734647 A | 9/2007 |

* cited by examiner

*Primary Examiner* — Alesa Allgood
(74) *Attorney, Agent, or Firm* — Seed IP Law Group

(57) ABSTRACT

The present disclosure is directed to a method of manufacturing one or more needles of a probe card by refining and processing a conductive body that extends from the probe card to form a respective tip at the end of the respective conductive body. Forming the respective tip of a respective needle includes removing respective portions from the end of the conductive body by flowing an electrolytic fluid between a conductive pattern structure and an end of the respective conductive body. Removing the respective portions with the flow of the electrons may be performed in multiple successive steps to form various needles with various sizes, shapes, and profiles (e.g., cylindrical, rectangular, triangular, trapezoidal, etc.).

20 Claims, 13 Drawing Sheets

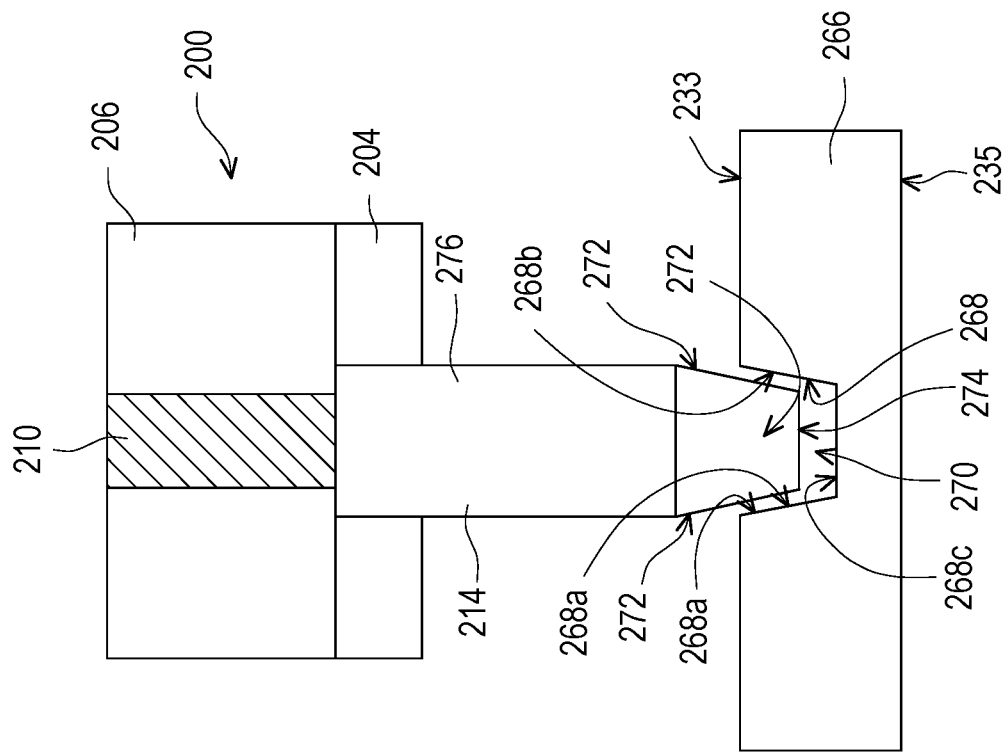
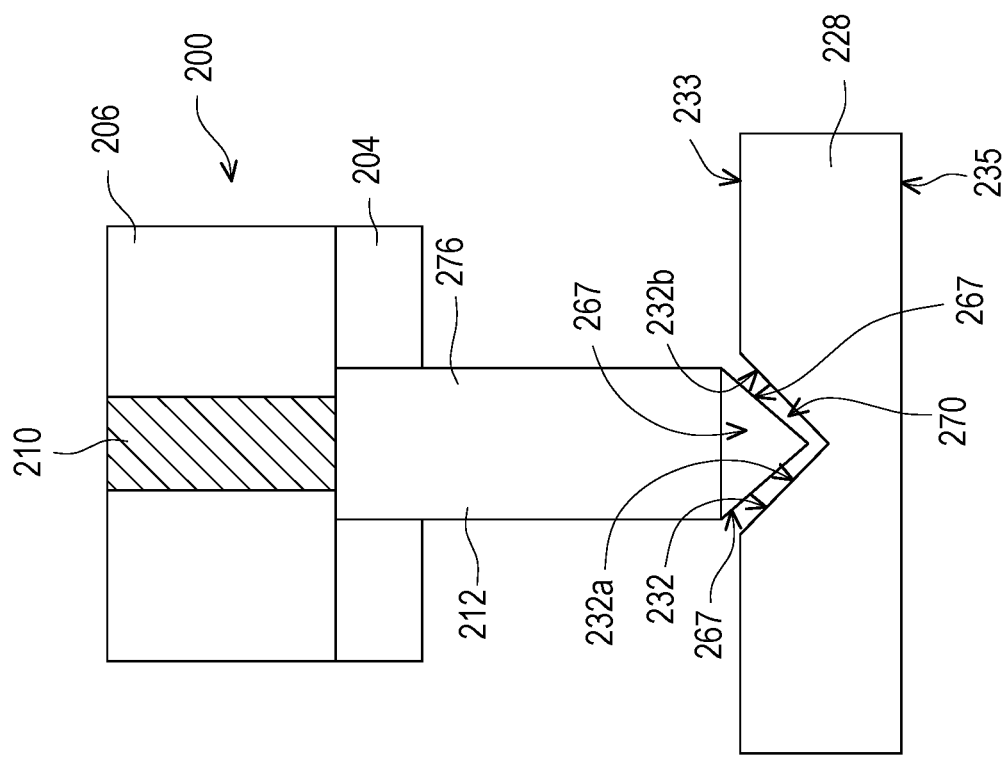
FIG. 4E
FIG. 4D

US 12,326,463 B2

PROBE CARD NEEDLE SHAPE AND METHOD OF MANUFACTURING

PRIORITY CLAIM AND CROSS-REFERENCE

This application claims benefit of U.S. Provisional Patent Application No. 63/382,473 filed Nov. 4, 2022, which is incorporated by reference herein in its entirety.

BACKGROUND

Probe cards with needles are utilized for testing continuity of conductive layers (e.g., conductive vias, conductive lines, conductive traces, etc.) that form electrical connections within a device under test (DUT). For example, the DUT may be a semiconductor wafer that has been processed and manufactured to include one or more conductive layers to form various electrical connections within the semiconductor wafer. The needles of a probe card may be brought into contact with these one or more conductive layers and an electrical signal may be introduced and passed through these one or more conductive layers through the needles of the probe card. This testing may be performed before the semiconductor wafer is singulated into multiple ones of semiconductor integrated circuits or chips.

The needles of the probe cards may be formed and manufactured with a selected shape or profile by polishing the needles with one or more polishing pads. For example, the needles may be sharpened to have a point by grinding and polishing material away from a conductive body by introducing polishing pads of decreasing grits successively.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 4D is a side view of a pattern of a conductive pattern structure utilized to perform the method of manufacture as shown in FIGS. 4A-4C to form at least one needle as shown in FIGS. 5A-5C, in accordance with some embodiments.

FIG. 4E is a side view of a pattern of a conductive pattern structure utilized to perform the method of manufacturing as shown in FIGS. 4A-4C to form at least one needle as shown in FIGS. 6A-6C, in accordance with some embodiments.

DETAILED DESCRIPTION

Figure 1:
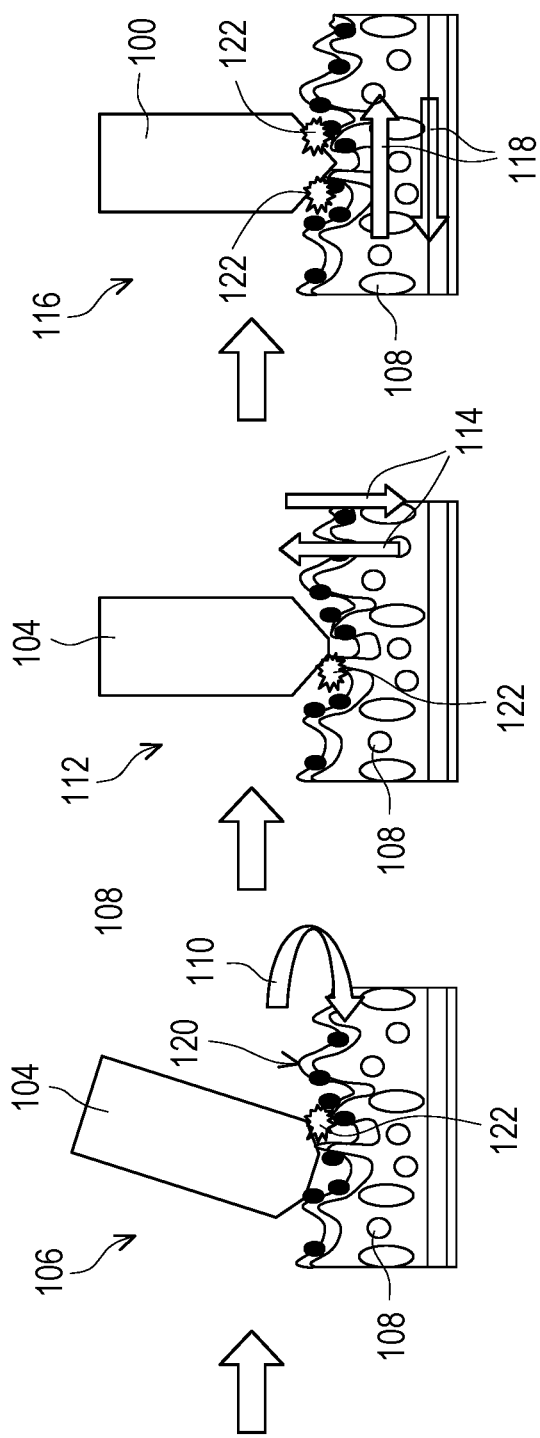
FIG. 1 is a side view of a method of manufacturing a needle of a probe card.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "top", "side", "bottom," "left," "right," "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Generally, semiconductor devices (e.g., semiconductor dice, semiconductor integrated circuits, etc.) are manufactured by forming various conductive layers to form various conductive structures (e.g., conductive vias, conductive traces, etc.) on a semiconductor wafer that will eventually be electrical pathways and electrical connections that are present within a manufactured semiconductor device. A probe card may be utilized for testing electrical continuity of the various conductive layers by electrical routing signals through the various conductive layers to test and confirm that the conductive layers have been properly formed on the semiconductor wafer. For example, the probe card may include a first pin and a second pin that are spaced apart from each other and attached to opposite ends of a respective conductive layer (e.g., a conductive trace) and an electrical routing signal may be passed through the first pin, the conductive trace, and the second pin. The characteristics of the electrical routing signal may be monitored to determine whether the respective conductive layer is within selected tolerance such that the semiconductor wafer may be processed further to eventually form a manufactured semiconductor device.

Figure 2:
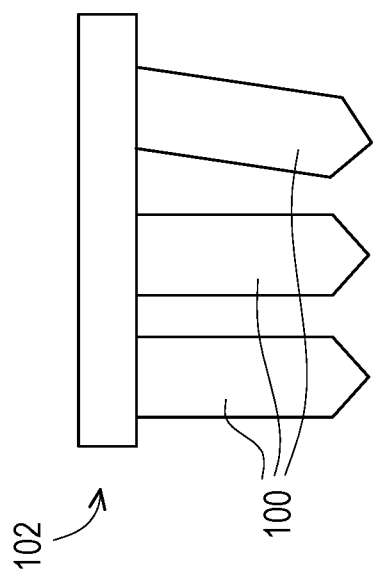
FIG. 2 is a side view of a probe card manufactured utilizing the method of manufacturing the needle as shown in FIG. 1.

FIG. 1 is a side view of a method of manufacturing a needle or pin 100 of a probe card 102. As shown in FIG. 1, the needle 100 of the probe card 102 is formed by polishing a conductive body 104 of the probe card 102 to process and refine the conductive body 104 into the needle 100 with a selected profile. As shown in FIG. 2, the selected profile of the needle 100 includes a sharp pointed end. For example, in a first polishing step 106, a first polishing pad 108 with a first grit is brought into contact with the conductive body 104 to remove respective portions from the conductive body 104. In the first polishing step 106, the first polishing pad is rotated as represented by an arrow 110. After the first polishing step 106, a second polishing step 112 is carried out in which the first polishing pad 108 is moved in an upward and downward direction as represented by arrows 114 to further refine and remove respective portions of the conductive body 104 in forming the needle 100 with the selected profile. After the second polishing step 112, a third polishing step 116 is carried out in which the first polishing pad 108 is moved in a rightward and leftward direction as represented by arrows 118 to further refine and remove respective portions of the conductive body 104 in forming the needle with the selected profile. In some situations, after carrying out the first, second, and third polishing steps 106, 112, 116 with the first polishing pad 108, the first, second, and third polishing steps 106, 112, 116 may be repeated with a second polishing pad with a second grit that is less than the first grit to further refine the needle 100. In some situations, after carrying out the first, second, and third polishing steps 106, 112, 116 with the second polishing pad, the first, second, and third polishing steps 106, 112, 116 may be repeated with a third polishing pad with a third grit that is less than the first and second grits to further refine the needle 100.

As shown in FIG. 1, the first polishing pad 108 has a polishing surface that is uneven and has several high points (e.g., peaks) and low points (e.g., valleys) between adjacent ones of the respective peaks at a surface 120 of the first polishing pad 108. When performing the first, second, and third polishing steps 106, 112, 116 of the method of manufacturing as discussed in detail above with respect to FIG. 1, the needle 100 abuts and contacts the first polishing pad 108 at various contact locations 122. While refining and removing respective portions from the conductive body 104 to form the needle 100 with the selected profile, the needle 100 may be deformed or translated into an angled position. For example, as shown in FIG. 2, the needle 100 at the right-hand side of the probe card 102 based on the orientation of the probe card 102 as shown in FIG. 2 is at an angle. The needle 100 being in this angled position results in the probe card 102 providing inaccurate feedback or information when testing electrical continuity of conductive structures (e.g., conductive vias, conductive traces, electrical vias, electrical traces, etc.) formed on a semiconductor wafer when manufacturing semiconductor devices (e.g., dies, chips, integrated circuits, etc.). This may result in an increase in manufacturing of semiconductor devices outside selected tolerances that may be shipped to customers due to the inaccurate feedback or information when performing the test with the probe card 102 having the needle 100 at the angled position. The needle 100 being in the angled position as shown in FIG. 2 may result in the probe card 102 having a shorter usable life span relative to if the needle 100 was not in the angled position.

The needle 100 may be finished slightly unevenly due to the unevenness (e.g., respective high points and respective low points) along the surface of the first polishing pad. This unevenness in the finishing of the needle 100 may result in the probe card 102 having a shorter usable life span relative to if the needle 100 was more uniformly finished.

The present disclosure is at least directed to some embodiments of a method of manufacturing as well as at least some embodiments of devices and structures utilized in those methods of manufacturing of the present disclosure to avoid the issues as set forth above with respect to FIGS. 1 and 2. For example, the present disclosure is at least directed to some embodiments of a method of manufacturing utilizing a patterned conductive structure with one or more patterns through which an electrolytic fluid may be flowed through to form a needle with a selected profile of a probe card. This method of manufacturing of the present disclosure may reduce the likelihood or prevent the angled position and unevenness in the finish of the needle 100 as discussed above with respect to FIGS. 1 and 2.

Figure 3:
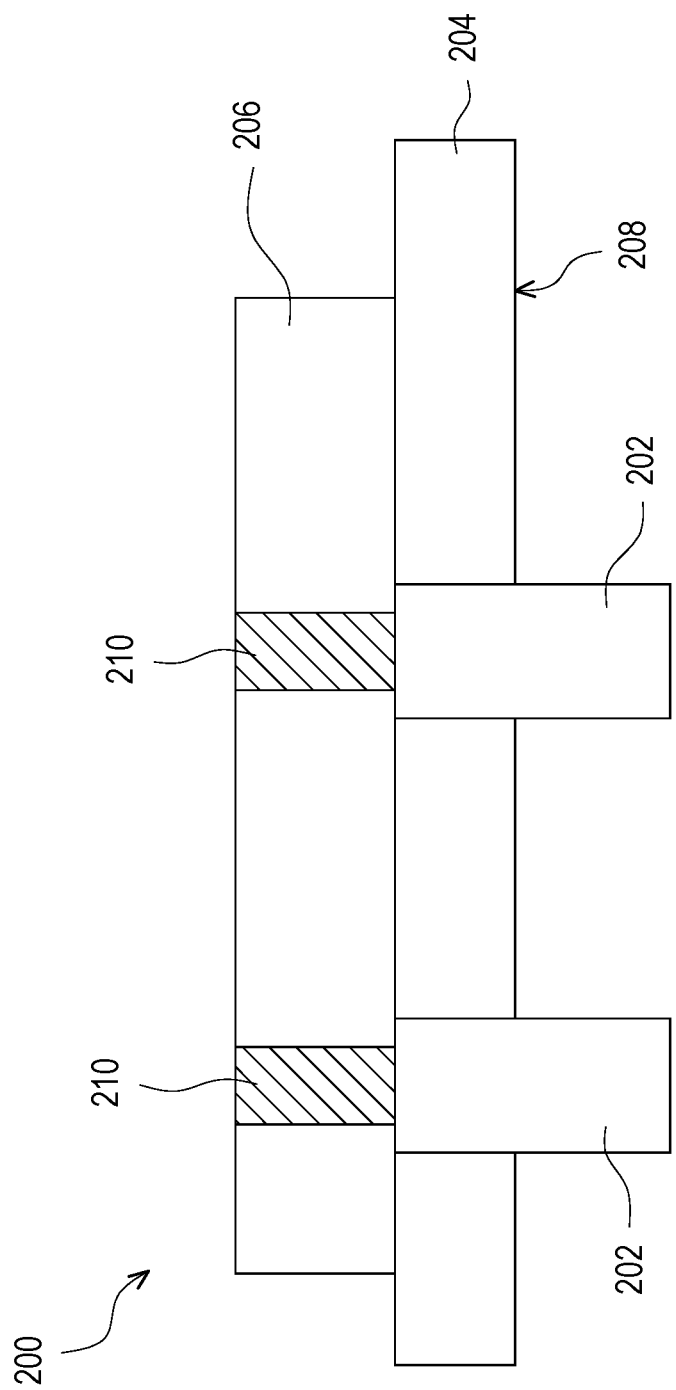
FIG. 3 is a side view of a probe card to be processed and refined by a method of manufacturing, in accordance with some embodiments.

FIG. 3 is a side view of a probe card 200 including conductive bodies, structures, protrusions, or extensions 202 to be processed and refined by a method of manufacturing, in accordance with some embodiments. The conductive bodies 202 extend through a non-conductive body 204 to a conductive pathway structure 206. The conductive bodies 202 extend and protrude outward from a surface 208 of the non-conductive body 204. The non-conductive body 204 may be a probe head of the probe card 200. As shown in FIG. 3, there is a pair of the conductive bodies 202. However, in some alternative embodiments of the probe card 200, the probe card 200 may include only one of the conductive bodies 202 or may include more than two of the conductive bodies 202.

Each one of the conductive bodies 202 is coupled to a corresponding one of conductive pads 210, which are within the conductive pathway structure 206. The conductive pathway structure 206 is an anode such that the conductive pads 210 are anode pads. An electrical signal may be passed through the conductive bodies 202 by a power or electrical source that is in electrical communication with the conductive pads 210. As will be discussed with respect to FIGS. 4A-4E, the conductive bodies 202 will be refined and processed to form respective needles 212, 214 (see FIGS. 4D, 4E, 5A-5C, and 6A-6C of the present disclosure) from the conductive bodies 202 of the probe card 200.

Figure 4A:
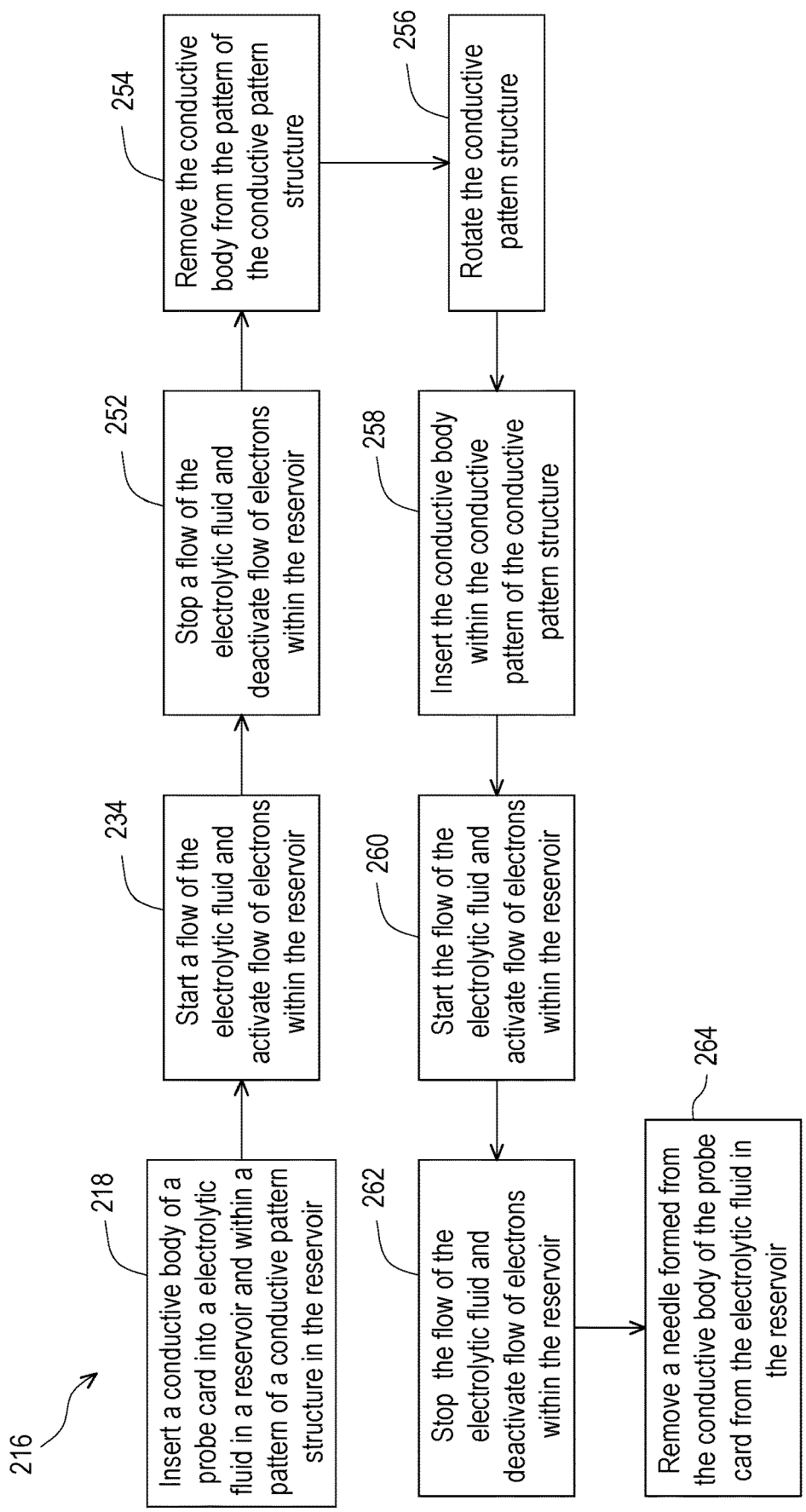
FIG. 4A is a flowchart of a method of manufacturing to process and refine one or more needles of the probe card as shown in FIG. 2, in accordance with some embodiments.
Figure 4B:
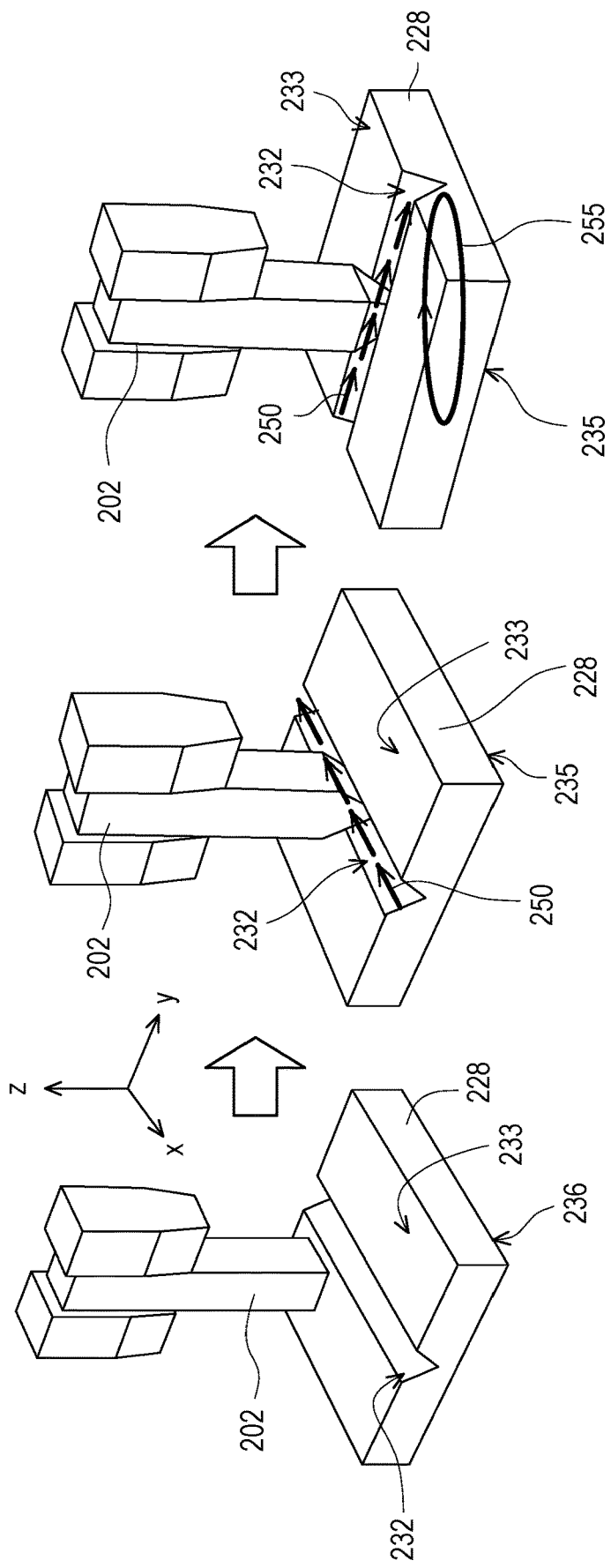
FIG. 4B shows multiple perspective views of steps in the flowchart of the method of manufacturing as shown in FIG. 4A to process and refine the one or more needles of the probe card as shown in FIG. 3, in accordance with some embodiments.
Figure 4C:
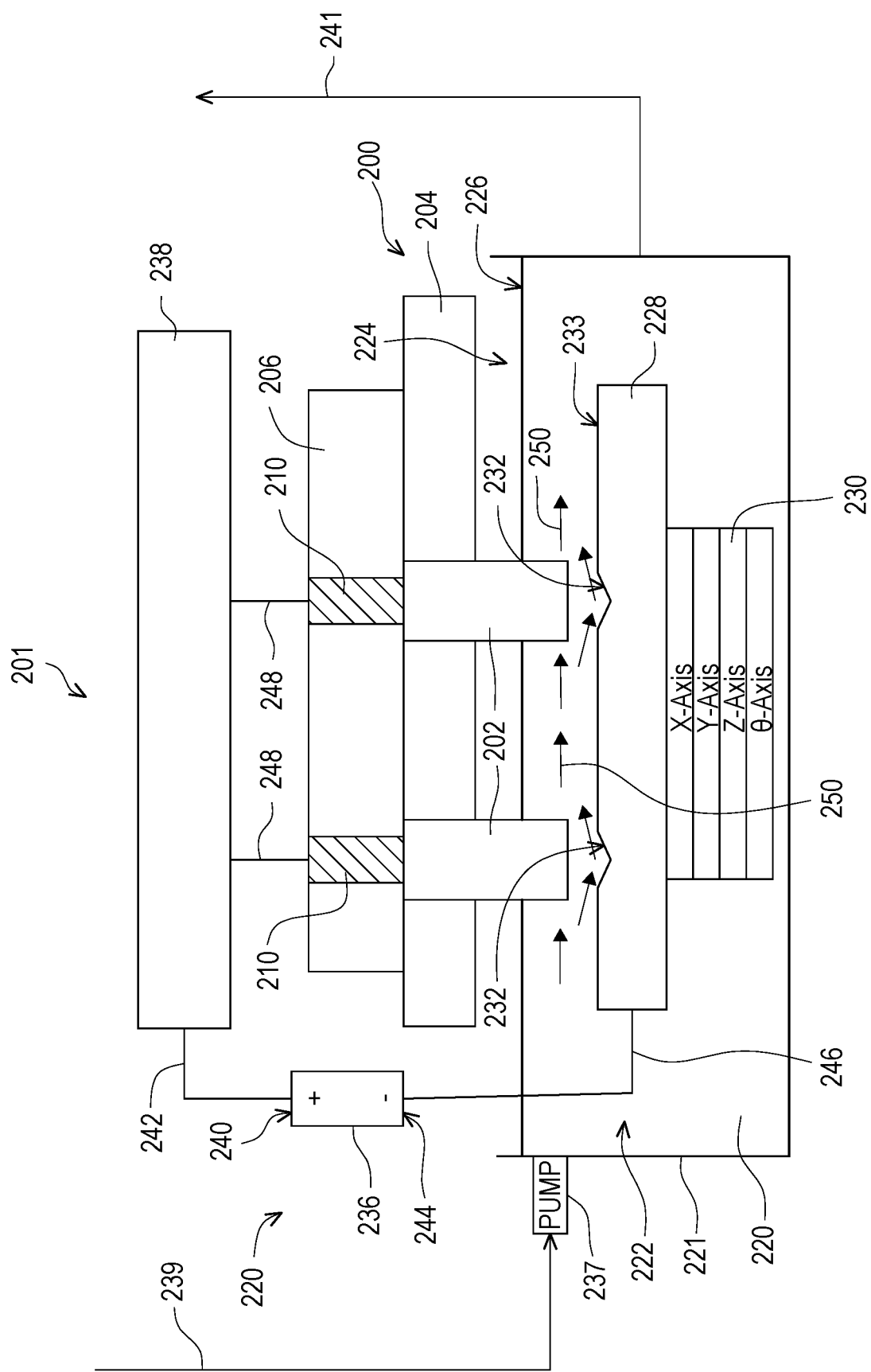
FIG. 4C is a side view of a system for performing the steps of the method of manufacturing as shown in FIGS. 4A and 4B to process and refine the one or more needles of the probe card as shown in FIG. 3, in accordance with some embodiments.

FIG. 4A is a flowchart 216 of a method of manufacturing needles 212, 214 (see FIGS. 4D, 4E, 5A-5C, and 6A-6C of the present disclosure) by refining and processing the conductive bodies. FIG. 4B are perspective views of steps in the method of manufacturing of the flowchart 216 of the method of manufacturing the needles 212, 214 (see FIGS. 4D, 4E, 5A-5C, and 6A-6C of the present disclosure). FIG. 4C is a side view of a probe card needle refinement and manufacturing system 201 for performing the method of manufacturing the needles 212, 214 in the flowchart 216. For the sake of simplicity and brevity of the present disclosure, the following discussion of the method of manufacturing in the flowchart 216 will focus on forming only one of the needles 212 utilizing one of the conductive bodies 202 as shown in FIGS. 4D and 5A-5C of the present disclosure. However, it will be readily appreciated that the following discussion will readily apply to forming more than one of the needles 212 and for forming only one of or more than one of the needles 214 by refining and processing the conductive bodies 202 in the same or similar fashion.

In a first step 218, the probe card 200 is transported to a system and the conductive body 202 is inserted into an electrolytic fluid 220 present within a reservoir 222 of a tank 221 through an opening 224 of the tank 221. The opening 224 of the tank 221 is in fluid communication with the reservoir 222 of the tank 221. The end of the conductive body 202 is fully submerged below a surface 226 of the electrolytic fluid 220 within the reservoir 222. Once the end of the conductive body 202 is fully submerged within the electrolytic fluid 220, a conductive pattern structure 228 within the reservoir 222 and submerged within the electrolytic fluid 220 may be oriented and positioned by an orientation structure or device 230 that is in mechanical cooperation with the conductive pattern structure 228. The orientation structure or device 230 may translate (e.g., X-axis, Y-axis, Z-axis) in various directions, rotate (θ-axis) in a clockwise or counterclockwise direction in various planes, or a combination of both. The orientation structure or device 230 orients and positions the conductive pattern structure 228 such that a pattern 232, which may be a channel, a recess, or some other suitable or like type reference to the pattern 232, is aligned with the conductive body 202 and such that the end of the conductive body 202 is within the pattern 232. When the end of the conductive body 202 is within the pattern 232, a channel, gap, or fluid passageway 270 (see FIGS. 4D and 4E of the present disclosure) is present between the end of the conductive body 202 and respective surfaces of the end of the conductive body 202 such that the end of the conductive body does not physically contact or abut the conductive pattern structure 228. The pattern 232 may be one of a plurality of patterns 232, and each one of the plurality of patterns 232 may be aligned with a corresponding one of the pair of conductive bodies 202 as shown in FIG. 4C. For example, the orientation structure 230 may move the conductive pattern structure 228 in an upward direction based on the orientation as shown towards the conductive body 202 such that the end of the conductive body 202 is inserted into the pattern 232.

After the first step 218, a second step 234 is carried out in which a power source 236 is activated (e.g., turned on) to initiate a flow of electrons in the electrolytic fluid 220 between a first surface or side 233 of the conductive pattern structure 228 and the end of the conductive body 202. The orientation structure 230 is coupled to a second surface or side 235 of the conductive pattern structure 228. The power source 236 may be activated by actuating or activating a switch 238 that is in electrical communication with the power source 236. A first pole 240 of the power source 236 is coupled to the switch 238 through a first conductive pathway 242, and a second pole 244 is coupled to the conductive pattern structure 228, which is a cathode, through a second conductive pathway 246. The switch 238 is coupled to the conductive pads 210 of the conductive pathway structure 206, which is the anode, of the probe card 200 by one or more third conductive pathways 248. Once the switch 238 is in the "turned on" position, an electrical signal from the power source 236 passes through the switch 238, the conductive pad 210, the conductive body 202, the electrolytic fluid 220, and the conductive pattern structure 228 such that a flow of electrons within the electrolytic fluid 220 is initiated. The flow of electrons in the electrolytic fluid 220 is due to these electrons being repelled from the conductive bodies 202 (e.g., anodes) and being attracted to the conductive pattern structure 228 (e.g., cathode). As the electrons move away from the end of the conductive body 202 and towards the conductive pattern structure 228, respective portions of the end of the conductive body 202 are removed over time. This process of removal of the respective portions from the end of the conductive body 202 due to this flow of electrons caused by the electrons being attracted conductive pattern structure 228, which is the cathode, and being repelled from the end of the conductive body 202, which is an anode, may be referred to as electrochemical refinement process, or may be referred to electrochemical polishing or electrochemical machining. This electrochemical refinement process as discussed above may be similar or like to the reverse of an electroplating process.

In the second step 234, a flow of the electrolytic fluid 220 may be directed through the patterns 232 by activating a pump 237 that is in fluid communication with the reservoir 222 of the tank 221. The flow of the electrolytic fluid 220 caused by activating the pump 237 is represented by arrows 250. The flow of the electrolytic fluid 220 causes the electrolytic fluid 220 to pass through the patterns 232 in the conductive body 228 to further facilitate refinement and processing of the conductive body 202 to form the needle 212. For example, this flow of the electrolytic fluid 220 represented by the arrows 250 may move precipitates (e.g., removed respective portions from the end of the conductive body 202) in the electrolytic fluid 220 away from the conductive pattern structure 228 such that surface finishing of the end of the needle 212 may be improved.

As shown in FIG. 4C, the pump 237 is external to the reservoir 222 of the tank 221. However, in some alternative embodiments, the pump 237 may be in the reservoir 222 of the tank 221. As shown in FIG. 4C, a first electrolytic fluid pathway 239 is in fluid communication with the pump 237. The first electrolytic fluid pathway 239 may be in fluid communication with an electrolytic fluid source such that the pump 237 may pump clean electrolytic fluid, which may be recycled and clean electrolytic fluid, into the reservoir 222. A second electrolytic fluid pathway 241 is in fluid communication with the reservoir 222 such that dirty or saturated electrolytic fluid may exit or be removed from the reservoir 222. The dirty or saturated electrolytic fluid may be saturated with the precipitates from removing respective portions from the conductive bodies 202 to form the needles 212. The second electrolytic fluid pathway 241 may transport the dirty or saturated electrolytic fluid to an electrolytic fluid recycle device or system to clean and recycle the electrolytic fluid such that the clean and electrolytic fluid may be reutilized and reintroduced into the reservoir 222 for removing respective portions from the conductive bodies 202 to form the needles 212.

The refinement and processing of the conductive body 202 to form the needle 212 in the second step 234 may be more readily seen in the enhanced, perspective view of the conductive body 202 as shown in the central illustration in FIG. 4B. During the second step 234, respective portions at two opposite sides of the end of the conductive body 202 are removed over time such that the conductive body 202 has surfaces that are at an angle at those two opposite sides of the end of the conductive body 202.

After the second step 234 in which the flow of the electrons and the electrolytic fluid 220 is performed for a selected period of time, a third step 252 is carried out in which the flow of the electrons is stopped by deactivating the power source 236, and the flow of the electrolytic fluid 220 is stopped by deactivating the pump 237. For example, the power source 236 may be deactivated by flipping the switch from the "turned on" position to the "turned off" position. The temperature of the electrolytic fluid 220 within the reservoir 222 may be controlled or selected. The flow of the electrolytic fluid 220 as represented by the arrows 250 may be stopped as well as turning "off" the pump 237 to stop the flow of the electrolytic fluid 220 as represented by the arrows 250.

After the third step 252, a fourth step 254 is carried out in which the partially refined and processed end of the conductive body 202 is removed from the pattern 232 at the first surface of side 233 of the conductive pattern structure 228. For example, the orientation structure 230 translates the conductive pattern structure 228 downward based on the orientation as shown in FIG. 4C such that the conductive pattern structure 228 moves away from the end of the conductive body 202. Moving the conductive pattern structure 228 downward and away from the end of the conductive body 202 in this fashion results in the end of the conductive body 202 being removed from the pattern 232 such that the end of the conductive body 202 is no longer present within the pattern 232.

After the fourth step 254, a fifth step 256 is carried out in which the conductive pattern structure 228 is rotated (e.g., clockwise or counterclockwise) by the orientation structure 230, which is represented by an arrow 255 (see FIG. 4B of the present disclosure). This rotating of the conductive pattern structure 228 occurs after the end of the conductive body 202 is fully removed from the pattern 232 such that proper clearance is provided to avoid physical contact between the end of the conductive body 202 and the conductive pattern structure 228 as the conductive pattern structure 228 is rotated. Providing complete clearance between the end of the conductive body 202 and the pattern 232 reduces the likelihood of causing misalignment or damage (e.g., bending, deformation, etc.) to the conductive body 202.

After the fifth step 256, a sixth step 258 is carried out in which the orientation structure 230 translates the conductive pattern structure 228 in an upward direction opposite to the downward direction based on the orientation as shown in FIG. 4C. As the conductive pattern structure 228 moves upward, the conductive pattern structure 228 moves towards the end of the conductive body 202. The orientation structure 230 translates the conductive pattern structure 228 in the upward direction until the end of the conductive body 202 is inserted back into the pattern 232 of the conductive pattern structure 228 at the first surface or side 233 of the conductive pattern structure 228. When the end of the conductive body 202 is within the pattern 232, the gap 270 (see FIGS. 4D and 4E of the present disclosure) is present between the end of the conductive body 202 and respective surfaces of the end of the conductive body 202 such that the end of the conductive body does not physically contact or abut the conductive pattern structure 228. Once the end of the conductive body 202 has been inserted into the pattern 232, the orientation structure 230 holds the conductive pattern structure 228 in a stationary position.

After the sixth step 258, a seventh step 260 is carried out in which the switch 238 is switched from the "turned off" position to the "turned on" position. This flipping of the switch 238 to the "turned on" position reactivates the power source 236 such that the electrical signal passes through the switch 238, the conductive pad 210, the conductive body 202, the electrolytic fluid 220, and the conductive pattern structure 228 such that the flow of electrons starts back up within the electrolytic fluid 220.

In the seventh step 260, the flow of the electrolytic fluid 220 as represented by arrows 250 may be started back up by turning "on" the pump 237, which may be present within the reservoir 222. The flow of the electrolytic fluid 220 caused by activating the pump 237 is represented by the arrows 250. The flow of the electrolytic fluid 220 causes the electrolytic fluid 220 to pass through the patterns 232 in the conductive body 228 to further facilitate refinement and processing of the conductive body 202 to form the needle 212 in a similar manner as discussed above with respect to the second step 234 of the flowchart 216.

The refinement and processing of the conductive body 202 to form the needle 212 in the seventh step 260 may be more readily seen in the enhanced, perspective view of the conductive body 202 as shown in the right-most illustration in FIG. 4B. During the seventh step 260, respective portions at two opposite transverse sides, which are transverse to the two opposite sides from which the respective portions of the end of the conductive body 202 were previously removed in the second step 234, of the end of the conductive body 202 are removed to further refine and process the end of the conductive body 202. The removal of these respective portions at the two opposite transverse sides at the end of the conductive body 202 over time eventually results in the formation of the needle 212 as shown in FIGS. 4D and 5A-5C of the present disclosure.

After the seventh step 260, an eighth step 262 is carried out in which the switch 238 is switched from the "turned on" position to the "turned off" position to stop the electrical signal from the power source 236 and to stop the flow the electrons within the electrolytic fluid 220. In the eighth step, the pump 237 is also turned "off" to stop the flow of the electrolytic fluid 220 as represented by the arrows 250. At this point the end of the conductive body 202 has been refined and processed to form the needle 212 as shown in FIGS. 4D and 5A-5C of the present disclosure.

After the eighth step 262, a ninth step 264 is carried out in which the end of the needle 212, which was previously the end of the conductive body 202, is removed from the electrolytic fluid 220 within the reservoir. In some embodiments, the needle 212 may be further processed or cleaned before utilizing the probe card 200 to test electrical continuity within various conductive and electrical structures (e.g., conductive vias, conductive traces, etc.) formed on a semiconductor wafer with a semiconductor manufacturing plant (FAB).

As shown in FIG. 4D, which may be after the eighth step 262 has been carried out but before the ninth step 264 has been carried out, when the end of the conductive body 202 is present within the pattern 232, a plurality of angled surfaces 267 at the end of the conductive body 202 have been formed due to the flow of the electrons the electrolytic fluid 220 between the end of the conductive body 202 and the plurality of angled surfaces 232a, 232b of the pattern 232. The gap 270 is present between the plurality of angled surfaces 232a, 232b and the plurality of angled surfaces 232a, 232b such that the end of the conductive body 202 and respective surfaces at the end of the conductive body 202 do not physically contact or abut the conductive pattern structure 228. The gap 270 provides clearance such that the flow of the electrons in the electrolytic fluid 220 may flow from the end of the conductive body 202 to remove respective portions of the conductive body 202 to form the needle 212. The gap 270 may also provide clearance such that the flow of the electrolytic fluid 220 may flow past and along the end of the conductive body 202 and the plurality of angled surfaces 232a, 232b of the pattern 232 of the conductive pattern structure 228, for example, see the flow of the electrolytic fluid as represented by arrows 250 as shown in FIGS. 4B and 4C, respectively. The pattern 232 in FIG. 4D has a triangular profile. However, in some alternative embodiments, the pattern 232 may have some other size or shape (e.g., trapezoid, rhomboid, curved, etc.) depending on a selected profile for an alternative embodiment of a needle to be formed by refining and processing the conductive body 202. The plurality of angled surfaces 267 mimic the plurality of angled surfaces 232a, 232b.

While in the above discussion it is set forth that the end of the conductive body 202 does not physically contact or abut the conductive pattern structure 228 when refining and processing the conductive body 202 to form the needle 212, in some alternative embodiments, the conductive body 202 may come into contact or may physically abut the conductive pattern structure 228 depending on a selected profile of an alternative embodiment of a respective needle.

In view of the above discussion, forming the needle 212 with the electrochemical refinement process in the flowchart 216 reduces the likelihood or prevents misalignment issues or defects as compared to utilizing the method as discussed above with respect to FIGS. 1 and 2. For example, while the method, as shown in FIGS. 1 and 2, includes physically contacting the conductive body 104 with the first polishing pad 108 to refine and process the conductive body 104 into the needle 100, which may cause the misalignment issue or defect shown in FIG. 2, utilizing the electrochemical refinement process as discussed with respect to FIGS. 4A, 4B, and 4C reduces the likelihood or prevents this type of misalignment defect as the conductive pattern structure 228 is generally not brought into physical contact with the conductive body 202 to form the needle 212. Instead of physical contact, as between the first polishing pad 108 and the conductive body 104 to form the needle 100, respective portions of the conductive body 202 are removed from the conductive body 202 by the flow of the electrons in the electrolytic fluid 220 and the flow of the electrolytic fluid 220 through the gap 270 between the end of the conductive body 202 and the pattern 232 of the conductive pattern structure 228. This flow of the electrons in the electrolytic fluid 220 and the flow of the electrolytic fluid 220 to remove the respective portions from the conductive body 202 reduces external forces applied to the conductive body 202 when forming the needle 212 as compared to when utilizing the first polishing pad 108 to remove respective portions from the conductive body 104 to form the needle 100. In other words, utilizing the method of manufacturing as discussed with respect to FIGS. 4A, 4B, and 4C of the present disclosure reduces the likelihood or prevents the misalignment issue or defect as discussed above with respect to FIGS. 1 and 2.

In view of the above discussion, forming the needle 212 with the electrochemical refinement process in the flowchart 216 may improve an overall finishing of the end of the needle 212 as compared to utilizing the method as discussed above with respect to FIGS. 1 and 2 to form the needle 100. For example, while the method, as shown in FIGS. 1 and 2, includes physically contacting the conductive body 104 with the first polishing pad 108 to refine and process the conductive body 104 into the needle 100, which may cause the uneven finishing due to the high points and low points along the surface 120 of the first polishing pad 108, utilizing the electrochemical refinement process as discussed with respect to FIGS. 4A, 4B, and 4C improves the surface finishing at the end of the needle 212 as the conductive pattern structure 228 is generally not brought into physical contact with the conductive body 202 to form the needle 212. Instead of physical contact as between the first polishing pad 108 and the conductive body 104 to form the needle 100 that may be difficult to maintain in a uniform and consistent manner, respective portions of the conductive body 202 may be removed more uniformly from the conductive body 202 as the flow of the electrons may be controlled in a more uniform and consistent manner to remove the respective portions from the conductive body 202 to form the needle 212. In some embodiments, the flow of the electrolytic fluid 220 may be controlled by the pump 237 in a more uniform and consistent manner (e.g., laminar) to remove respective portions from the conductive body 202 to from the needle 212. In some embodiments, a direction of flow of the electrolytic fluid 220 through the patterns 232 during different steps of the method of manufacturing in the flowchart 216 may be controlled by actuating a pump in a different manners during different steps of the method of manufacturing in the flowchart 216. In some embodiments, a plurality of the pumps 237 may be present to control various directions of flow of the electrolytic fluid 220 during different steps of the method of manufacturing in the flowchart 216. In other words, utilizing the method of manufacturing as discussed with respect to FIGS. 4A, 4B, and 4C of the present disclosure may improve the surface finishing at the end of the needle 212 as compared to the method of manufacturing as discussed above with respect to FIGS. 1 and 2.

As set forth earlier, while the above discussion of the method of manufacturing in the flowchart 216 focuses on forming the needle 212 as shown in FIGS. 4D and 5A-5C of the present disclosure, the method of manufacturing the flowchart 216 may be utilized to form the needle 214 as shown in FIGS. 4E and 6A-6C by utilizing a conductive pattern structure 266 shown in FIG. 4E instead of the conductive pattern structure 228 shown in FIGS. 4A-4D. The conductive pattern structure 266 is similar to the conductive pattern structure 228, however, unlike the conductive pattern structure 228, the conductive pattern structure 266 has one or more patterns 268.

As shown in FIG. 4E, the conductive pattern structure 266 includes a pattern 268 that includes a pair of angled surfaces 268a, 268b and a transverse surface 268c that is transverse to the pair of angled surfaces 268a, 268b. The transverse surface 268c extends from a first angled surface 268a of the pair of angled surfaces 268a, 268b to a second angled surface 268b of the pair of angled surfaces 268a, 268b opposite to the first angled surface 268a. The pattern 268 has a trapezoidal profile. However, in some alternative embodiments, the pattern 232 may have some other size or shape (e.g., triangular, rhomboid, curved, etc.) depending on a selected profile for an alternative embodiment of a needle to be formed by refining and processing the conductive body 202. FIG. 4E may be after the eighth step 262 has been carried out but before the ninth step 264 has been carried out such that the end of the conductive body 202 is present within the pattern 232 and has a plurality of angled surfaces 272 and a transverse surface 274 that extends between ones of the plurality of angled surfaces 272. The plurality of angled surfaces 272 and the transverse surface 274 mimic the respective surfaces 268a, 268b, 268c of the pattern 268.

Figure 5A:
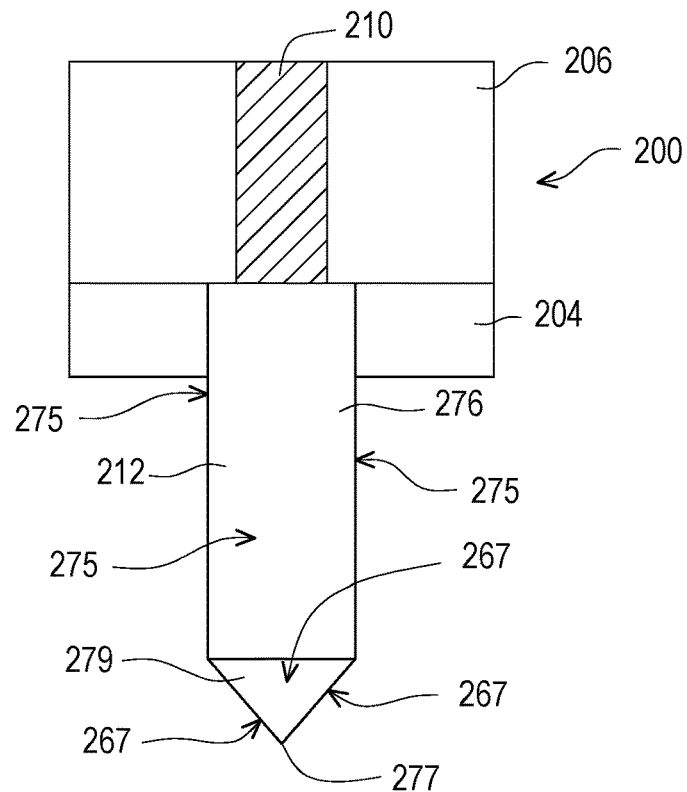
FIG. 5A is a side view of the at least one needle of the one or more needles after the method of manufacturing to process and refine the one or more needles of the probe card as shown in FIGS. 3 and 4, in accordance with some embodiments.
Figure 5B:
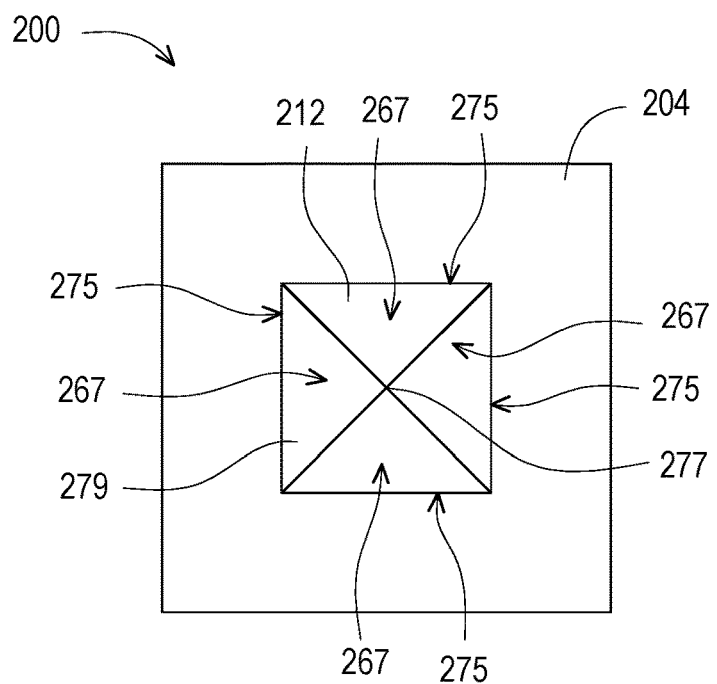
FIG. 5B is a bottom side view of the at least one needle of the one or more needles as shown in FIG. 5A, in accordance with some embodiments.
Figure 5C:
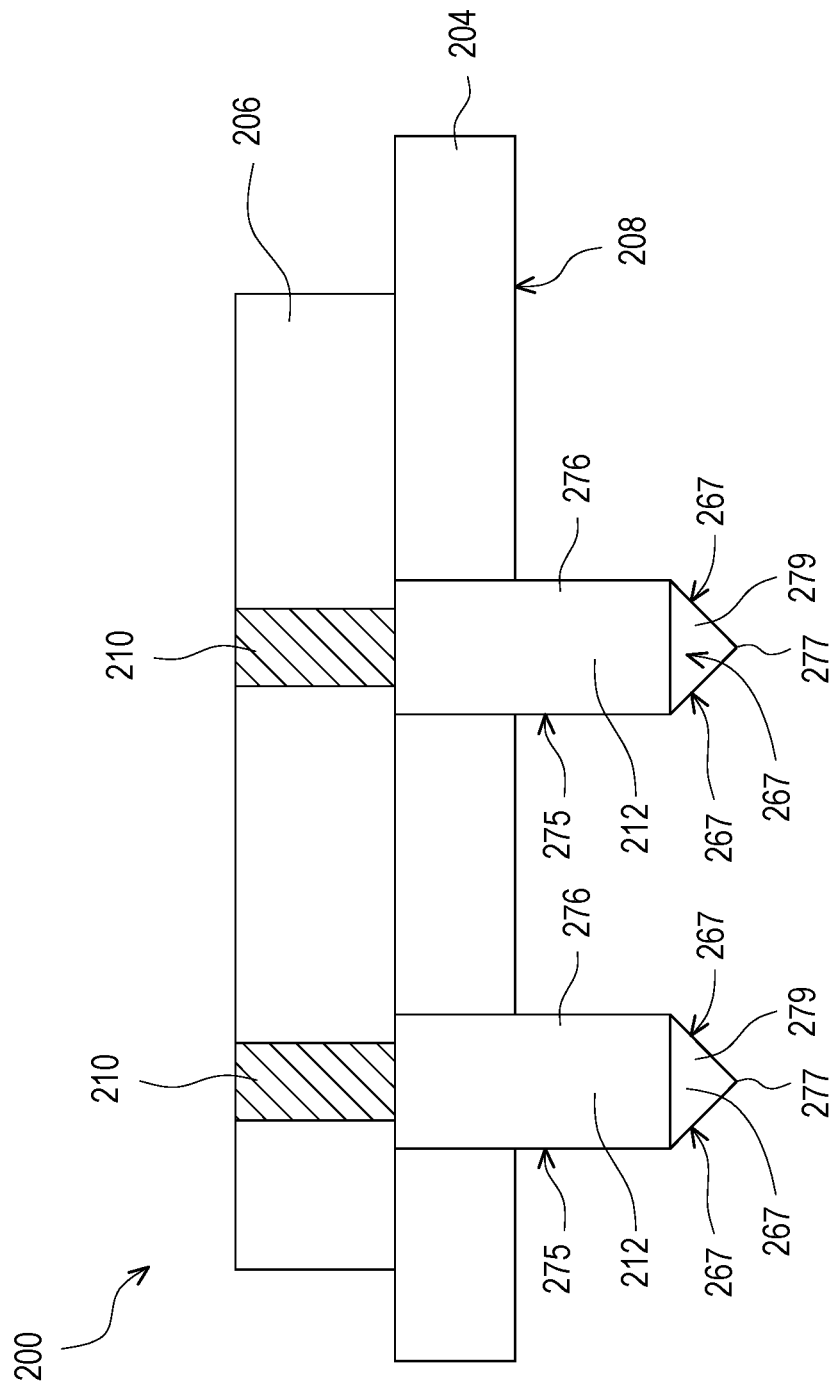
FIG. 5C is a side view of the probe card including the one or more needles the same or similar to the at least one needle as shown in FIGS. 5A and 5B, in accordance with some embodiments.

FIG. 5A is a side view of the needle 212, which may be a first needle of a plurality of needles of the probe card 200, manufactured utilizing the method in the flowchart 216 and the conductive pattern structure 228. FIG. 5B is a bottom view of the end of the needle 212 manufactured utilizing the method in the flowchart 216 and the conductive pattern structure 228. FIG. 5C is a side view of the probe card 200 with a plurality of the needles 212 as shown in FIGS. 5A and 5B.

As shown in FIG. 5A, the needle 212 includes a point or tip 277 at which the plurality of angled surfaces 267 come together at the point 277. The plurality of angled surfaces 267 extends from corresponding sidewalls 275 of a first portion 276, which is rectangular, of the needle 212, and a second portion 279, which is a tip portion, extends from the first portion 276 and includes the plurality of angled surfaces 267. In some alternative embodiments, the rectangular portion 276 may be a cylindrical portion instead (e.g., see FIGS. 7A-7C of the present disclosure). The point 277 may be a sharp point that is to be utilized to contact various conductive structures (e.g., conductive vias, conductive traces, conductive pathways, etc.) of a fully or partially processed and refined semiconductor wafer to test electrical continuity of those various conductive structures. The point 277 is at the end of the conductive body 202 that is further away from the non-conductive body 204 of the probe card 200.

As shown in FIG. 5A, the plurality of angled surfaces 267 includes four angled surfaces 267. In some alternative embodiments, there may be a lesser or greater number of the plurality of angled surfaces 267. For example, the second, third, fourth, fifth, sixth, seventh, and eighth steps 234, 252, 254, 256, 258, 260, 262 are carried out a greater number of times as discussed above with respect to the flowchart 216 to form the needle 212, the plurality of angled surfaces 267 may include more than four (e.g., five, six, seven, etc.). Alternatively, if the sixth, seventh, and eighth steps 258, 260, 262 are not carried out as discussed above with respect to the flowchart 216 to form the needle 212, the plurality of angled surfaces 267 may include only two. The number of the plurality of angled surfaces 267 may alternatively be controlled or determined by a size, shape, and profile of the pattern 232 of the conductive pattern structure 228.

Figure 7A:
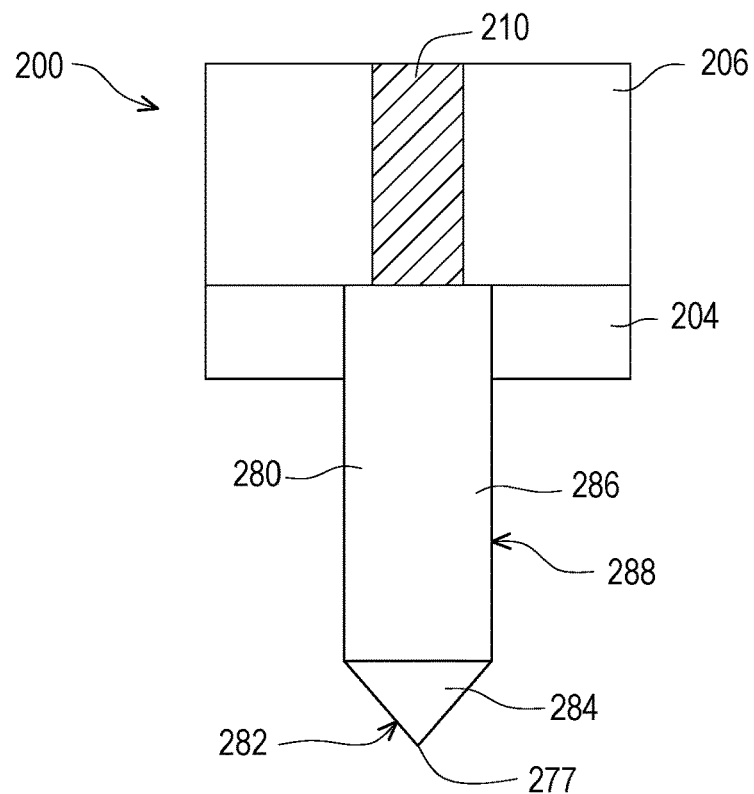
FIG. 7A is a side view of at least one needle of the one or more needles after the method of manufacturing to process the one or more needled as shown in FIG. 3, in accordance with some embodiments.
Figure 7B:
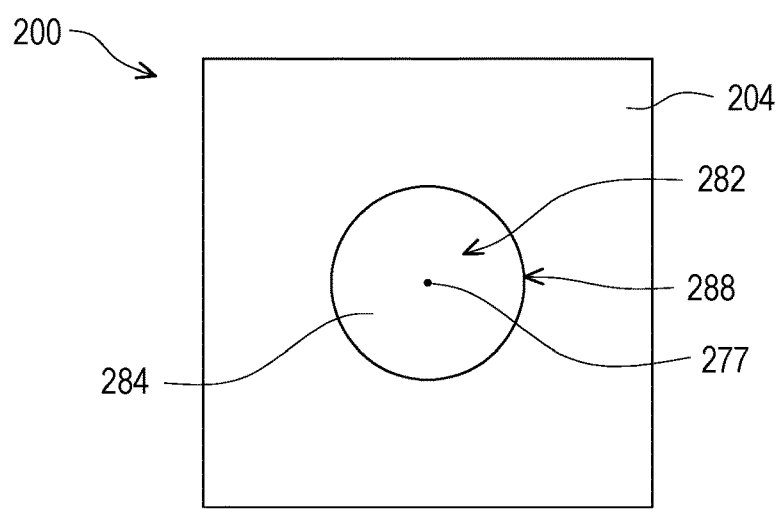
FIG. 7B is a bottom side view of the at least one needle of the one or more needles as shown in FIG. 7A, in accordance with some embodiments.

As shown in FIG. 5B, the needle 212 has a rectangular or square profile. In some alternative embodiments, for example, as shown in FIGS. 7A and 7B of the present disclosure, a needle 280 may have a cylindrical profile, size, and shape such that a first portion 286 is a cylindrical portion and a curved angular surface 282 (see FIGS. 7A and 7B of the present disclosure) of a second portion 284 of the needle 212 extends from the first portion 286 to the point 277. In yet some other alternative embodiments, a needle 290 may have a triangular profile such that there are three of a plurality of sidewalls 294 and three of a plurality of angled surfaces 296 that each have a triangular profile when viewed from the bottom side of the needle 290 (see FIGS. 8A and 8B of the present disclosure).

Figure 6A:
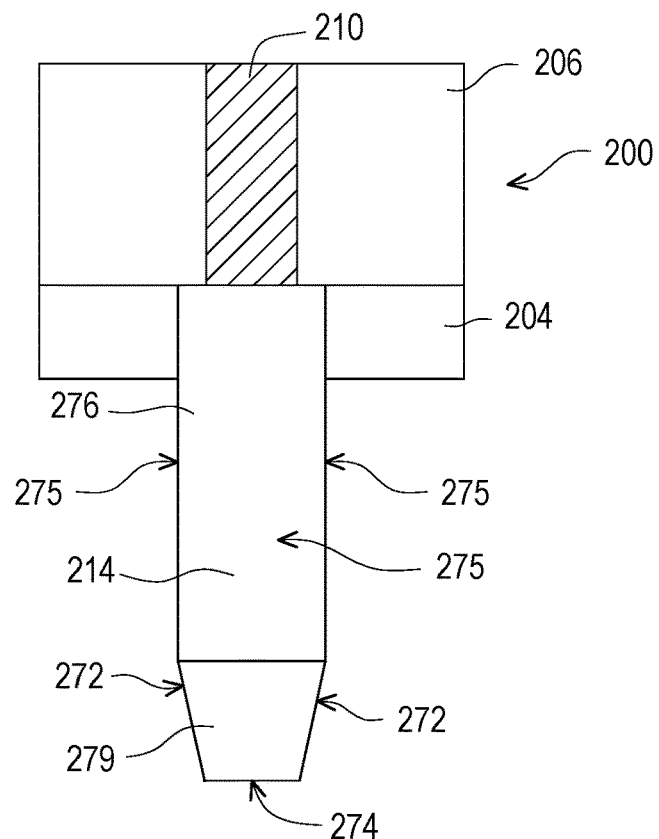
FIG. 6A is a side view of at least one needle of the one or more needles after the method of manufacturing to process and refine the one or more needles as shown in FIG. 3, in accordance with some embodiments.
Figure 6B:
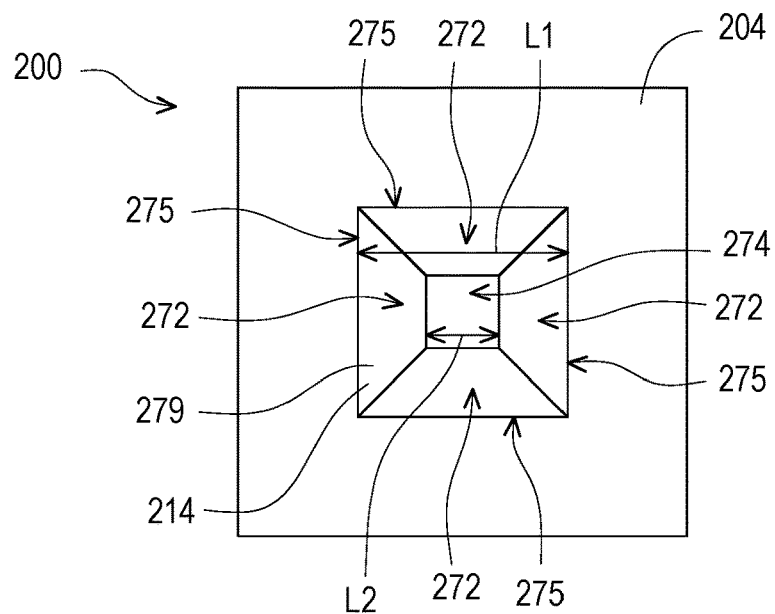
FIG. 6B is a bottom side view of the at least one needle of the one or more needles as shown in FIG. 6A, in accordance with some embodiments.
Figure 6C:
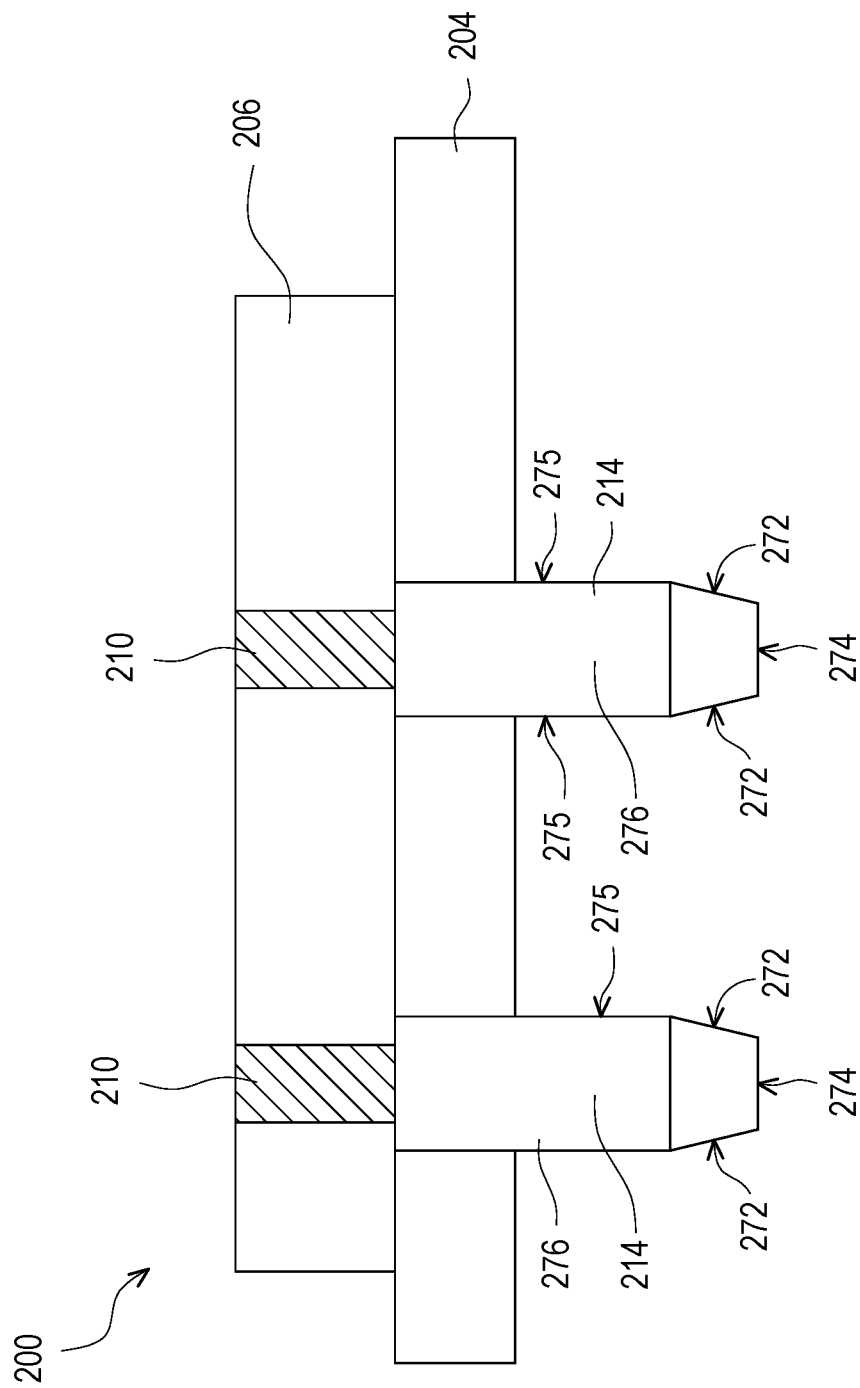
FIG. 6C is a side view of the probe card including the one or more needles the same or similar to the at least one needle as shown in FIGS. 6A and 6B, in accordance with some embodiments.

FIG. 6A is a side view of the needle 214, which may be a first needle of a plurality of needles of an alternative embodiment of the probe card 102, manufactured utilizing the method in the flowchart 216 and the conductive pattern structure 266 (see FIG. 4E of the present disclosure). FIG. 6B is a bottom view of the end of the needle 212 manufactured utilizing the method in the flowchart 216 and the conductive pattern structure 266 (see FIG. 4E of the present disclosure). FIG. 6C is a side view of an alternative embodiment of the probe card 200 with a plurality of the needles 214 having the size and shape as shown in FIGS. 6A and 6B. For the sake of simplicity and brevity of the present disclosure, the same or similar features of the needle 214 relative to the needle 212 will have the same or similar reference numerals, and only differences between the needle 214 and the needle 212 will be the focus of the following discussion with respect to the needle 214 relative to the needle 212.

Unlike the embodiment of the needle 212 as shown in FIGS. 5A and 5B, the needle 214 as shown in FIGS. 6A and 6B includes the transverse surface 274 at the end of the needle 214 and has a rectangular or square profile. The plurality of angled surfaces 272 extends from the plurality of sidewalls 275 to the transverse surface 274. In other words, the transverse surface 274 of the needle 214, as shown in FIGS. 6A-6C, replaces the tip 277 (e.g., sharp point) of the needle 212 as shown in FIGS. 5A-5C. As the transverse surface 274 is present instead of the tip 277 in the needle 214, the plurality of angled surfaces 272 each extend from a corresponding sidewall of the plurality of sidewalls 275 to the transverse surface 274. As shown in FIGS. 6B, each one of the plurality of angled surfaces 272 have a trapezoidal shape and profile when viewed from the bottom side of the needle 214.

As shown in FIG. 6B, the needle 214 has a rectangular or square profile. In some alternative embodiments, the needle 214 may have a cylindrical size and shape such that the transverse surface 274 of the needle 214 may be circular. In yet some other alternative embodiments, the needle 212 may have a triangular profile such that there are three of the plurality of sidewalls 275 and three of the plurality of angled surfaces 272, and the transverse surface 274 has a triangular profile when viewed from the bottom side of the needle 212.

As shown in FIG. 6B, the needle 214 includes a first dimension L1 and a second dimension L2. The first dimension L1 extends between opposite ones of the plurality of sidewalls 275 and the second dimension L2 extends between opposite ones of the plurality of angled surfaces 272. The first dimension L1 is greater than the second dimension L2.

FIG. 7A is a side view of the needle 280, which may be a first needle of a plurality of needles of the probe card 200, manufactured utilizing a method similar to the method as discussed above with respect to FIGS. 4A-4E of the present disclosure. FIG. 7B is a bottom view of the end of the needle 280 as shown in FIG. 7A.

As shown in FIGS. 7A and 7B, the first portion 286 of the needle 280 includes a curved sidewall 288 from which the curved angled surface 282 extends to the point 277. The curved sidewall 288 is curved as the first portion 286 is cylindrical in profile, size, and shape. The second portion 284 has a conical profile, size, and shape due to the first portion 286 of the needle 280 having the cylindrical profile, size, and shape. While not shown, in some alternative embodiments of the probe card 200, the plurality of needles 212, 214 may be replaced with respective ones of the needle 280 as shown in FIGS. 7A and 7B. In some alternative embodiments of the needle 280, the point 277 may be replaced by a respective transverse surface 300 (see FIG. 9 of the present disclosure) similar to the transverse surface 274 such that the respective transverse surface has a circular profile, size, and shape when viewed from the bottom side of the needle 280.

Figure 8A:
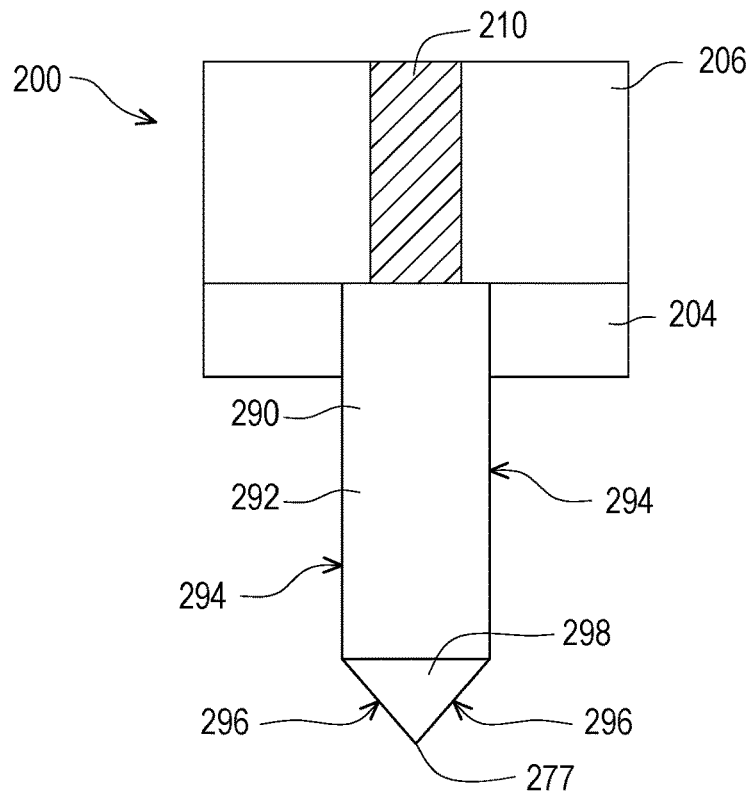
FIG. 8A is a side view of at least one needle of the one or more needles after the method of manufacturing to process the one or more needled as shown in FIG. 3, in accordance with some embodiments.
Figure 8B:
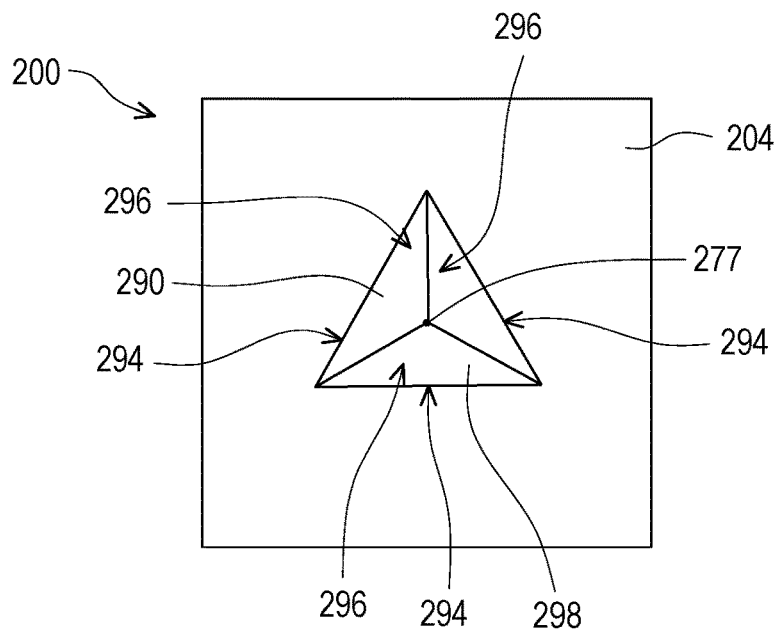
FIG. 8B is a bottom side view of the at least one needle of the one or more needles as shown in FIG. 7A, in accordance with some embodiments.

FIG. 8A is a side view of the needle 290, which may be a first needle of a plurality of needles of the probe card 200, manufactured utilizing a method similar to the method discussed above with respect to FIGS. 4A-4E of the present disclosure. FIG. 8B is a bottom view of the end of the needle 290 as shown in FIG. 8A.

As shown in FIGS. 8A and 8B, the first portion 292 of the needle 290 includes a plurality of sidewalls 294 from which a plurality of angled surfaces 296 extend to the point 277. The first portion 292 has a triangular profile, size, and shape such as a triangular prism. Each sidewall of the plurality of sidewalls 294 may have a rectangular profile, shape, and size, respectively. A second portion 298, which is a tip portion, includes the plurality of angled surfaces 296 and extends from the first portion 292. The second portion 298 has a pyramid-like profile, size, and shape. While not shown, in some alternative embodiments of the probe card 200, the plurality of needles 212, 214 may be replaced with respective ones of the needle 290 as shown in FIGS. 8A and 8B. In some alternative embodiments of the needle 290, the point 277 may be replaced by a respective transverse surface 302 (see FIG. 10 of the present disclosure) similar to the transverse surface 274 such that the respective transverse surface has a triangular profile, size, and shape when viewed from the bottom side of the needle 290.

Figure 9:
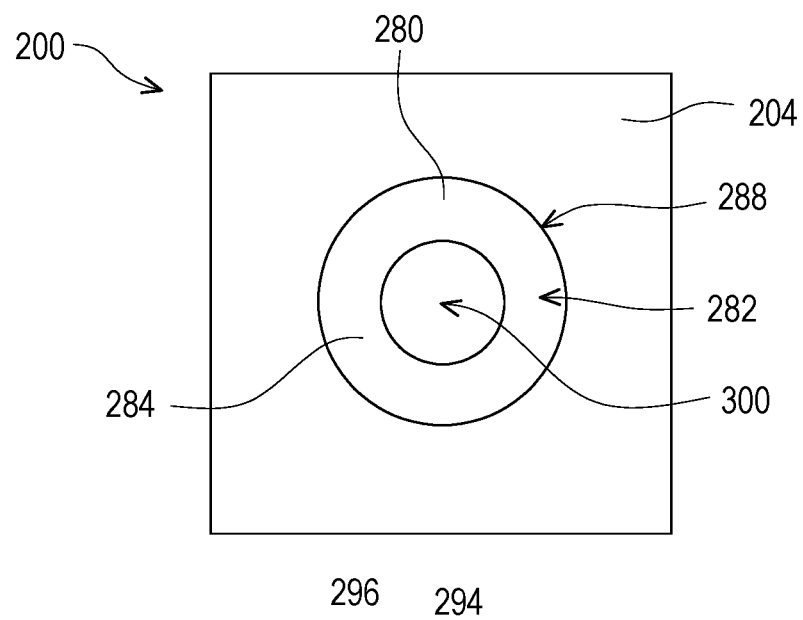
FIG. 9 is a bottom side view of an alternative embodiment of the at least one needle as shown in FIGS. 7A and 7B, in accordance with some embodiments.
Figure 10:
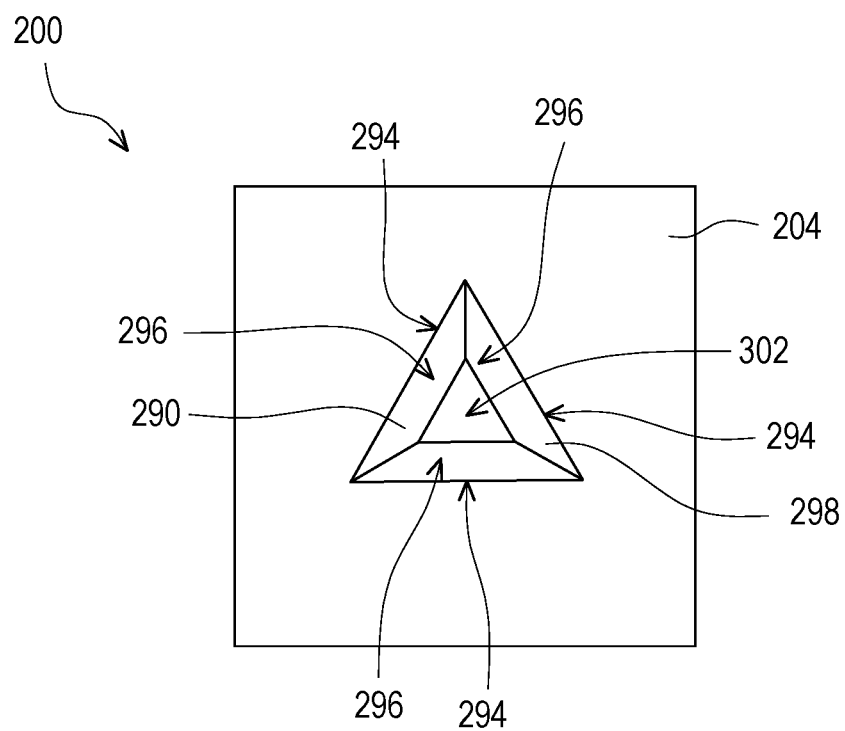
FIG. 10 is a bottom side view of an alternative embodiment of the at least one needle as shown in FIGS. 8A and 8B, in accordance with some embodiments.

FIG. 9 is a bottom side view of an alternative embodiment of the needle 280 including the respective transverse surface 300. FIG. 10 is a bottom side view of an alternative embodiment of the needle 290 including the respective transverse surface 302.

As discussed above, the method of manufacturing of the flowchart 216 of the present disclosure may be adapted and adjusted by structuring respective patterns of conductive pattern structures in different ways or by performing various steps of the flowchart 216 of the method of manufacturing in various orders. The method of manufacturing in the flowchart 216 provides the capability to manufacture variously sized, shaped, and profiled needles such as the various embodiments of the needles 212, 214, 280, 290 of the present disclosure have various shapes. These differently sized and shaped needles 212, 214, 280, 290, as well as other embodiments that may not be readily shown in the present disclosure, allow for a probe card to be manufactured that may be more readily capable of testing electrical continuity of different types of conductive structures that are formed on a semiconductor wafer. Utilizing the method of manufacturing in the flowchart 216 allows for the needles 212, 214, 280, 290 to have better surface finishing (e.g., greater uniformity) as compared to manufacturing the needle 100 with the polishing pad 108 as shown in FIG. 1. Utilizing the method of manufacturing in the flowchart 216 reduces the likelihood or prevents misalignment issues of the needle 100 as shown in FIG. 2. In other words, the method of manufacturing in the flowchart 216 allows for the various sized and shaped embodiments of respective needles of respective probe cards to be manufactured, improves surface finishing at tip portions of the respective needles that are to readily contact conductive structures for testing electrical continuity of those conductive structures, and reduces the likelihood or prevents misalignment issues as discussed with respect to FIG. 2. This overall improvement of manufacturing the probe card 200 with the various embodiments of the needles 212, 214, 280, 290 with the method of manufacturing in the flowchart 216 may allow for the probe card 200 to have a longer usable life span relative to the probe card 102 shown in FIG. 2 with the needles 100, which may not be finished as well utilizing the method shown in FIG. 1 and may have misalignment issues (see FIG. 2) due to utilizing the method shown in FIG. 1.

As discussed above, the method of manufacturing of the flowchart 216 of the present disclosure may be adapted and adjusted by structuring respective patterns of conductive pattern structures in different ways or by performing various steps of the flowchart 216 of the method of manufacturing in various orders. The method of manufacturing in the flowchart 216 provides the capability to manufacture variously sized, shaped, and profiled needles such as the various embodiments of the needles 212, 214, 280, 290 of the present disclosure have various shapes. These differently sized and shaped needles 212, 214, 280, 290, as well as other embodiments that may not be readily shown in the present disclosure, allow for a probe card to be manufactured that may be more readily capable of testing electrical continuity of different types of conductive structures that are formed on a semiconductor wafer.

At least one embodiment of a system of the present disclosure may be summarized as including: a tank including a reservoir within the tank and an opening through which the reservoir is accessible; a conductive pattern structure including a first side and a second side opposite to the first side, the conductive pattern structure is within the reservoir of the tank, and the conductive pattern structure including a pattern at a first side of the conductive pattern structure; and an orientation structure coupled to the second side of the conductive pattern structure, the orientation structure configured to rotate the conductive pattern structure.

At least one embodiment of a device of the present disclosure may be summarized as including: a conductive body including: a first side and a second side opposite to the first side; and a concave pattern including: a first recess that extends into the first side and terminates within the conductive body before reaching the second side, the first recess includes a first concave profile; and a second recess that extends into the first side and terminates within the conductive body before reaching the second side, the second recess is spaced apart from the first recess, the second recess includes a second concave profile.

At least one embodiment of a method of the present disclosure may be summarized as including: inserting respective tips of a plurality of conductive bodies of a probe card through an opening of a tank into an electrolytic fluid in a reservoir of the tank; aligning the respective tips of the plurality of conductive bodies with corresponding ones of a plurality of recesses in a conductive pattern structure; forming a plurality of needles including: removing first portions from the plurality of conductive bodies at the respective tips of the plurality of conductive bodies by applying an electrical signal to the electrolytic fluid initiating a flow of electrons in the electrolytic fluid between the conductive pattern structure and the respective tips of the plurality of conductive bodies, and by activating a pump initiating a flow of the electrolytic fluid between the conductive pattern structure and the respective tips of the plurality of conductive bodies; and removing the plurality of needles from the electrolytic fluid.

At least one embodiment of a device of the present disclosure may be summarized as including: a conductive pathway structure including at least one conductive pad; a non-conductive body on the conductive pathway structure; at least one conductive probe needle that extends into the non-conductive body, the at least one conductive probe coupled to the at least one conductive pad, the at least one conductive probe needle including: a sidewall; a tip portion including: a first angled surface that is transverse to the sidewall; and a second angled surface that is transverse to the sidewall and the first angled surface.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    inserting respective tips of a plurality of conductive bodies of a probe card through an opening of a tank into an electrolytic fluid in a reservoir of the tank;
    aligning the respective tips of the plurality of conductive bodies with corresponding ones of a plurality of recesses in a conductive pattern structure;
    forming a plurality of needles including:
    removing first portions from the plurality of conductive bodies at the respective tips of the plurality of conductive bodies by applying an electrical signal to the electrolytic fluid initiating a flow of electrons in the electrolytic fluid between the conductive pattern structure and the respective tips of the plurality of conductive bodies, and by activating a pump initiating a flow of the electrolytic fluid between the conductive pattern structure and the respective tips of the plurality of conductive bodies; and
    removing the plurality of needles from the electrolytic fluid.

2. The method of claim 1, wherein forming the plurality of needles further includes:
    after removing the first portions from the plurality of conductive bodies, stopping the flow of electrons in the electrolytic fluid and the flow of the electrolytic fluid between the conductive pattern structure and the respective tips of the plurality of conductive bodies;
    after stopping the flow of electrons in the electrolytic fluid and the flow of the electrolytic fluid, translating the conductive pattern structure away from the respective tips of the plurality of conductive bodies and rotating the conductive pattern structure and aligning corresponding ones of the plurality of recesses with the corresponding ones of the respective tips of the plurality of conductive bodies;
    after rotating the conductive pattern structure and aligning corresponding ones of the plurality of recesses with the corresponding ones of the respective tips of the plurality of conductive bodies, translating the conductive pattern structure towards the respective tips of the plurality of conductive bodies; and
    after translating the conductive pattern structure towards the respective tips of the plurality of conductive bodies, removing second portions from the plurality of conductive bodies at the respective tips of the plurality of conductive bodies by applying the electrical signal to the electrolytic fluid initiating the flow of electrons in the electrolytic fluid between the conductive pattern structure and the respective tips of the plurality of conductive bodies, and by activating a pump initiating a flow of the electrolytic fluid between the conductive pattern structure and the respective tips of the plurality of conductive bodies.

3. The method of claim 1, wherein the plurality of recesses have a concave profile.

4. The method of claim 3, wherein the concave profile is a triangular profile.

5. The method of claim 3, wherein the concave profile is a trapezoidal profile.

6. A method, comprising:
    inserting a first tip of a first conductive body of a probe card through an opening of a tank into an electrolytic fluid in a reservoir of the tank;
    aligning the first tip of the first conductive body with a first recess in a conductive pattern structure; and
    patterning the first tip of the first conductive body by removing a first portion from the first conductive body at the first tip of the first conductive body by applying an electrical signal to the electrolytic fluid initiating a flow of electrons in the electrolytic fluid between the conductive pattern structure and the first tip of the first conductive body, and by activating a pump initiating a flow of the electrolytic fluid between the conductive pattern structure and the first tip of the first conductive body.

7. The method of claim 6, wherein patterning the first tip of the first conductive body by removing the first portion from the first conductive body at the first tip of the first conductive body includes defining the first tip of the first conductive body to have a triangular prism profile.

8. The method of claim 6, further comprising:
    inserting a second tip of a second conductive body of the probe card through the opening of the tank into the electrolytic fluid in the reservoir of the tank, and inserting the second tip of the second conductive body into the electrolytic fluid in the reservoir of the tank occurs simultaneously along with inserting the first tip of the first conductive body into the electrolytic fluid in the reservoir of the tank;
    aligning the second tip of the second conductive body with a second recess in the conductive pattern structure, the second recess being spaced apart from the first recess; and
    patterning the second tip of the second conductive body by removing a second portion from the second conductive body at the second tip of the second conductive body by applying the electrical signal to the electrolytic fluid initiating the flow of electrons in the electrolytic fluid between the conductive pattern structure and the second tip of the second conductive body, and by activating the pump initiating the flow of the electrolytic fluid between the conductive pattern structure and the second tip of the second conductive body, and patterning the second tip of the second conductive body occurs simultaneously along with patterning the first tip of the first conductive body.

9. The method of claim 8, further comprising:
after removing the first portion of the first tip of the first conductive body and removing the second portion of the second tip of the second conductive body, reorienting of the conductive pattern structure aligning the first recess and the second recess in a different orientation relative to the first tip and the second tip, respectively;
after reorienting the conductive pattern aligning the first recess and the second recess in the different orientation relative to the first tip and the second tip, respectively, patterning the first tip of the first conductive body by removing a third portion of the first tip and patterning the second tip of the second conductive body by removing a fourth portion of the second tip.

10. The method of claim 8, wherein reorienting the conductive pattern structure further includes rotating the conductive pattern structure.

11. The method of claim 8, wherein patterning the first tip to remove the third portion and patterning the second tip to remove the fourth portion further includes defining the first tip of the first conductive body and the second tip of the second conductive body to have a triangular prism profile.

12. The method of claim 8, wherein patterning the first tip to remove the third portion and patterning the second tip to remove the fourth portion further includes defining the first tip of the first conductive body and the second tip of the second conductive body to have a trapezoidal prism profile.

13. The method of claim 6, further comprising:
after patterning the first tip of the first conductive body reorienting the conductive pattern structure to aligning the first recess in a different orientation relative to the first tip; and
after reorienting the conductive pattern structure aligning the first recess in the different orientation relative to the first tip, patterning the first tip of the first conductive body by removing a second portion of the first tip.

14. The method of claim 13, wherein patterning first tip of the first conductive body by removing the second portion of the first tip includes defining the first tip of the first conductive body to have a triangular prism profile.

15. The method of claim 13, wherein pattering the first tip of the first conductive body by removing the second portion of the first tip includes defining the first tip of the first conductive body to have a trapezoidal prism profile.

16. A method, comprising:
inserting a tip of a conductive body of a probe card through an opening of a tank into an electrolytic fluid in a reservoir of the tank;
orienting a recess in a conductive pattern structure relative to the tip of the conductive body in a first orientation with an orientation structure in mechanical cooperation with the conductive pattern structure;
moving the conductive pattern structure towards the tip of the conductive body with the orientation structure and positioning the tip into the recess when in the first orientation;
patterning the tip of the conductive body by removing a first portion from the conductive body at the first tip of the first conductive body by applying an electrical signal to the electrolytic fluid initiating a flow of electrons in the electrolytic fluid between the conductive pattern structure and the tip of the conductive body, and by activating a pump initiating a flow of the electrolytic fluid between the conductive pattern structure and the tip of the conductive body;
after removing the first portion from the first conductive body, moving the conducive pattern structure away from the first tip of the first conductive body;
reorienting the conductive pattern structure to orient the recess in the conductive pattern structure relative to the tip of the conductive body in a second orientation different from the first orientation;
moving the conductive pattern structure towards the tip of the conductive body with the orientation structure and positioning the tip into the recess when in the second orientation; and
patterning the tip of the conductive body by removing a second portion from the conductive body at the first tip of the first conductive body by applying the electrical signal to the electrolytic fluid initiating the flow of electrons in the electrolytic fluid between the conductive pattern structure and the tip of the conductive body, and by activating the pump initiating the flow of the electrolytic fluid between the conductive pattern structure and the tip of the conductive body.

17. The method of claim 16, wherein the recess has a triangular profile.

18. The method of claim 17, wherein, after patterning the tip of the conductive body by removing the second portion, the tip has a triangular prism profile.

19. The method of claim 16, wherein the recess has a trapezoidal profile.

20. The method of claim 19 wherein, after patterning the tip of the conductive body by removing the second portion, the tip has a trapezoidal profile.

* * * * *